United States Patent [19]

Tauchi

[11] Patent Number: 5,966,939
[45] Date of Patent: Oct. 19, 1999

[54] MULTISTAGE THERMOELECTRIC COOLING DEVICE

[75] Inventor: Hitoshi Tauchi, Kariya, Japan

[73] Assignee: Aisin Seiki Kabushiki Kaisha, Kariya, Japan

[21] Appl. No.: 09/033,517

[22] Filed: Mar. 2, 1998

[30] Foreign Application Priority Data

Feb. 28, 1997 [JP] Japan .................................. 9-045653
Feb. 25, 1998 [JP] Japan .................................. 10-043441

[51] Int. Cl.⁶ .................................................. F25B 21/02
[52] U.S. Cl. ............................ 62/3.2; 62/3.7; 62/3.8; 62/3.6
[58] Field of Search ................... 62/3.2, 3.7, 3.8, 62/3.6

[56] References Cited

FOREIGN PATENT DOCUMENTS 2-10781  1/1990  Japan .

*Primary Examiner*—Henry Bennett
*Assistant Examiner*—Mae Shulman.
*Attorney, Agent, or Firm*—Oblon, Spivak, McClelland, Maier & Neustadt, P.C.

[57] ABSTRACT

A multiple thermoelectric cooling device in which both ends of thermoelectric elements in first and second cooling units are soldered to the corresponding electrodes. In the first cooling unit, the melting point of a solder for soldering is higher, while in the second cooling unit the melting point of another solder for soldering is lower. Thus, in case soldering is performed in the second cooling unit with the same placed on the first cooling unit, the soldered connection in the first cooling unit will not be remelted.

10 Claims, 17 Drawing Sheets

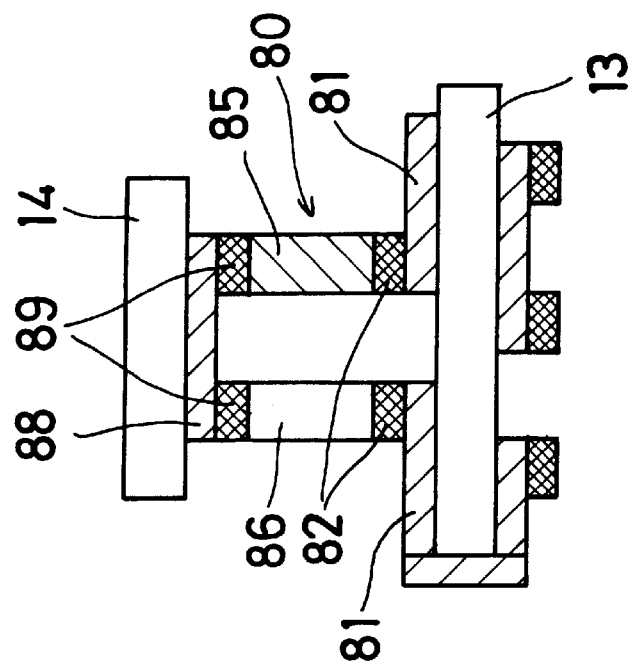
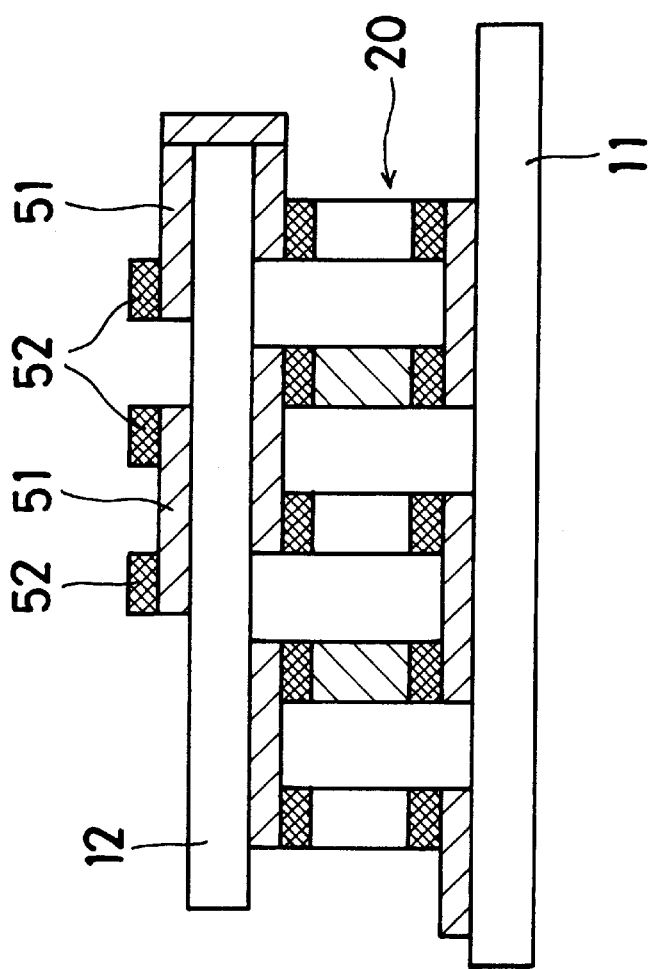
Fig. 11

MULTISTAGE THERMOELECTRIC COOLING DEVICE

BACKGROUND OF THE INVENTION

1. Field of the Invention

The present invention relates to a multistage thermoelectric cooling device including a plurality of stacked cooling units each of which is interposed between two vertically adjacent substrates so as to cool a substance on the most upper substrate, and in particular to a soldering structure between an end of a thermoelectric element and an electrode at which an amount of heat is evolved or absorbed by the Peltier effect.

2. Description of the Related Art

A known conventional multistage thermoelectric cooling device is disclosed in Japanese patent Laid-open Print No. Hei 2 (1990)-10781. This conventional multistage thermoelectric cooling device includes a plurality of cooling assemblies, each of which provides heat absorption at one side thereof by the Peltier effect, which are stacked in the vertical direction such that each cooling unit is interposed between two adjacent substrates so that the most upper substrate is brought into the most cooled condition. For providing the foregoing heat absorption, an electrode which constitutes a cold junction of two adjacent different type thermoelectric elements of the lower side cooling unit is adhered to a lower surface of its upper side substrate. The electrode is soldered with ends of the thermoelectric elements. Such soldering in the upper side cooling unit is established after completion of the soldering in the next lower cooling unit.

However, the heat used for soldering in the upper cooling unit which is mounted on the upper side substrate of the next lower cooling unit is transferred thereto when the upper side substrate is thin, resulting in that sometimes the soldering in the next lower cooling unit may become damaged or remelted. Thus, in the next lower cooling unit the connection strength becomes weak between the electrode and each of the thermoelectric elements and an unexpected offset of the former from the latter occurs. This means the designed performance and reliability of the multistage thermoelectric cooling device not be attained.

SUMMARY OF THE INVENTION

It is therefore one of the objects of the present invention is to provide a multistage thermoelectric cooling device without the foregoing drawbacks.

It is another object of the present invention is to provide a multistage thermoelectric cooling device to avoid a remelting of the soldering in one cooling unit which is beneath a substrate when soldering is performed in another cooling unit on the substrate.

In order to attain the foregoing objects, a multistage thermoelectric cooling device includes a first cooling unit in which both ends of a thermoelectric element are soldered to the corresponding electrodes by using a first solder, the first cooling unit being operated to absorb an amount of heat at it upper side relying on the Peltier effect; and a second cooling unit in which both ends of a thermoelectric element are soldered to the corresponding electrodes by using a second solder whose melting point is lower than that of the first solder. The second cooling unit is operated to absorb an amount of heat at its upper side relying on the Peltier effect, and is mounted on the first cooling device so as to be cooled thereby.

BRIEF DESCRIPTION OF THE DRAWINGS

The above and other objects, features and advantages of the present invention will be more apparent and more readily appreciated from the following detailed description of preferred exemplary embodiments of the present invention, taken in connection with the accompanying drawings, in which:

FIG. 11 shows a first cooling unit and a third cooling unit both of which are included in the device shown in FIG. 10;

DESCRIPTION OF THE PREFERRED EMBODIMENTS

Preferred embodiments of the present invention will be described hereinafter in detail with reference to the accompanying drawings.

First Embodiment

Figure 1:
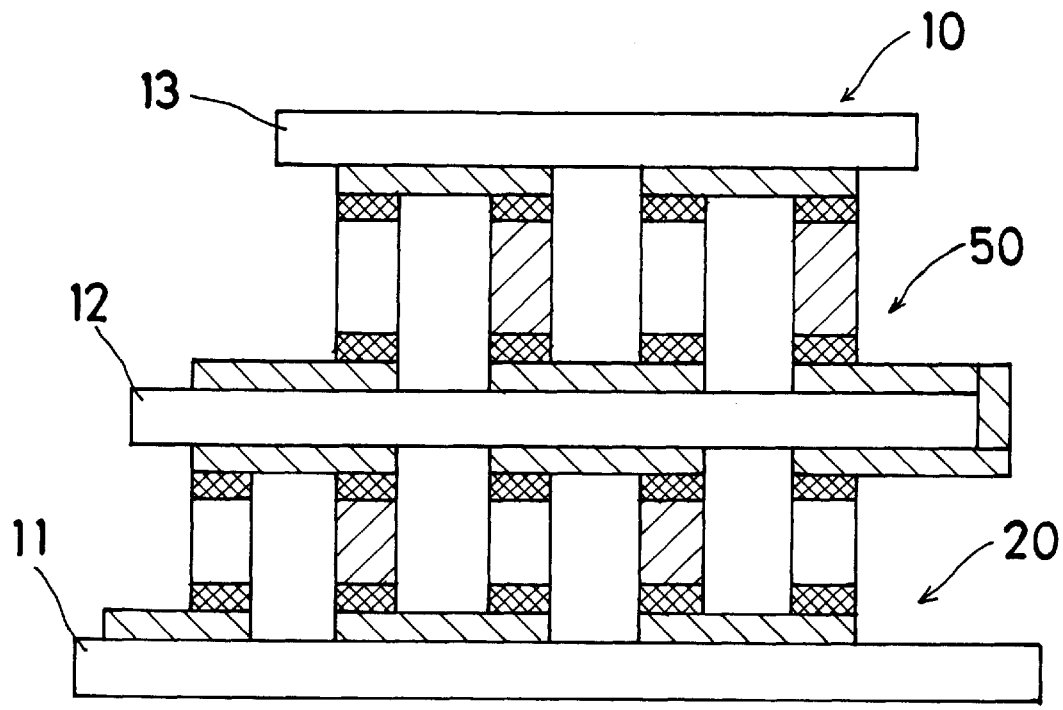
FIG. 1 shows an outline structure of a multistage thermoelectric cooling device according to a first embodiment of the present invention.

Referring first to FIG. 1, there is illustrated an outline structure of a multistage thermoelectric cooling device 10 according to a first embodiment of the present invention. The multistage thermoelectric cooling device 10 includes a first cooling unit 20 and a second cooling unit 50. The first cooling unit 20 is interposed between a first substrate 11 and the second substrate 12, while the second cooling unit 50 is interposed between the second substrate 12 and a third substrate 13. As will be detailed later, the first cooling unit 20 and the second cooling unit 50 are operated relying on the Peltier effect so that the second substrate 12 and the third substrate 13 are cooled. As a whole, the third substrate 13 on which may be positioned a substance (not shown) to be cooled is the coldest portion of the device 10.

Figure 2:
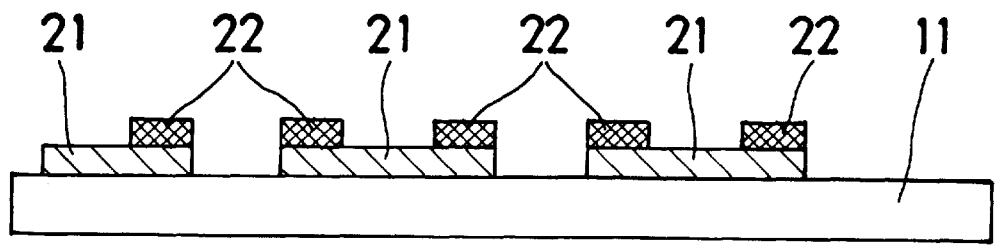
FIG. 2 shows a first substrate on which electrodes are provided at an initial stage of manufacturing process of a first-cooling unit of the device shown in FIG. 1.

In order to produce the foregoing multistage thermoelectric cooling device 10, the following steps or procedures are performed. First, as shown in FIG. 2, the first substrate 11 is prepared which is made from an aluminous-ceramic. The first substrate 11 has an upper surface on which cooper electrodes 21 are provided by means of a well-known patterning technique. One or more solders 22 in a creamy state are applied on each electrode 21. The solder 22 has a melting point of 220 degrees Celsius and a composition of 97 weight percent tin and 3 weight percent silver.

Figure 3:
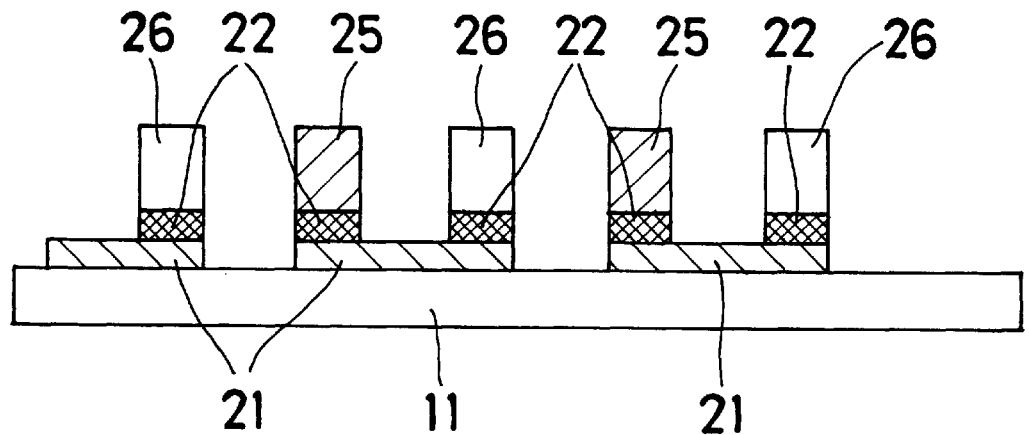
FIG. 3 shows how thermoelectric elements are mounted on the corresponding electrodes of the first substrate shown in FIG. 2.

Next, as shown in FIG. 3, either or both of p-type thermoelectric semiconductor chips 25 and n-type thermoelectric semiconductor chips 26 are alternately arranged on the corresponding solders 22 on the electrode 21.

Figure 4:
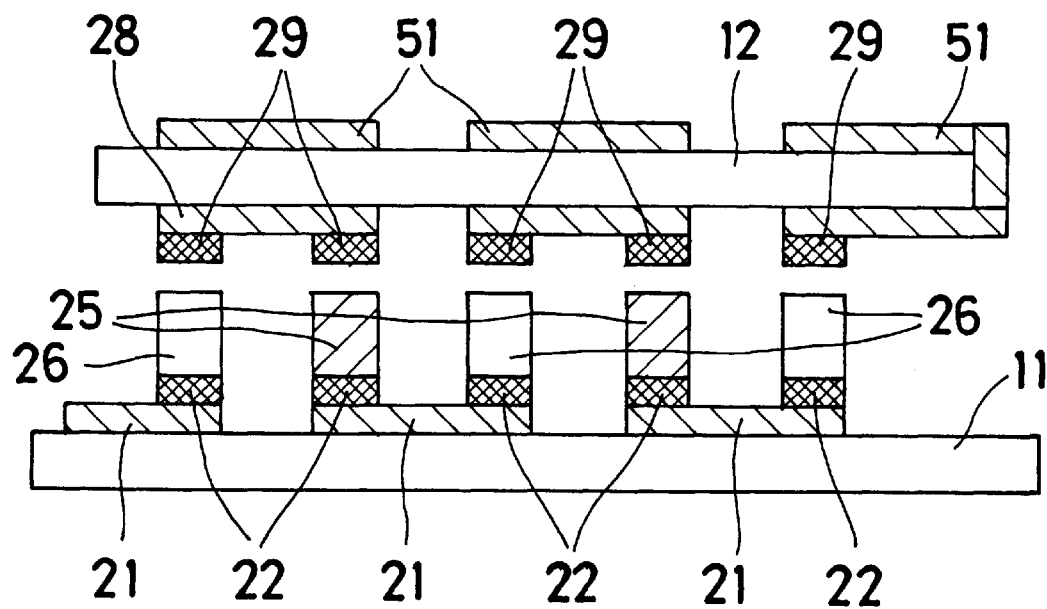
FIG. 4 shows a condition of a second substrate when it is going to be combined with the first substrate shown in FIG. 3.

As shown in FIG. 4, the resulting first substrate 11 is to be mounted with the second substrate 12 which is made from an aluminous-ceramic in such a manner that upper ends of the thermoelectric semiconductor chips 25 and 26 are opposed to solders 29 on electrodes 28 on a lower surface of the second substrate 12. It is noted that on an upper surface of the second substrate 12 is provided with electrodes 51 and the rightmost electrode 51 is electrically connected to the rightmost electrode 28. The solder 29 is identical with the solder 22 in melting point and composition.

Figure 5:
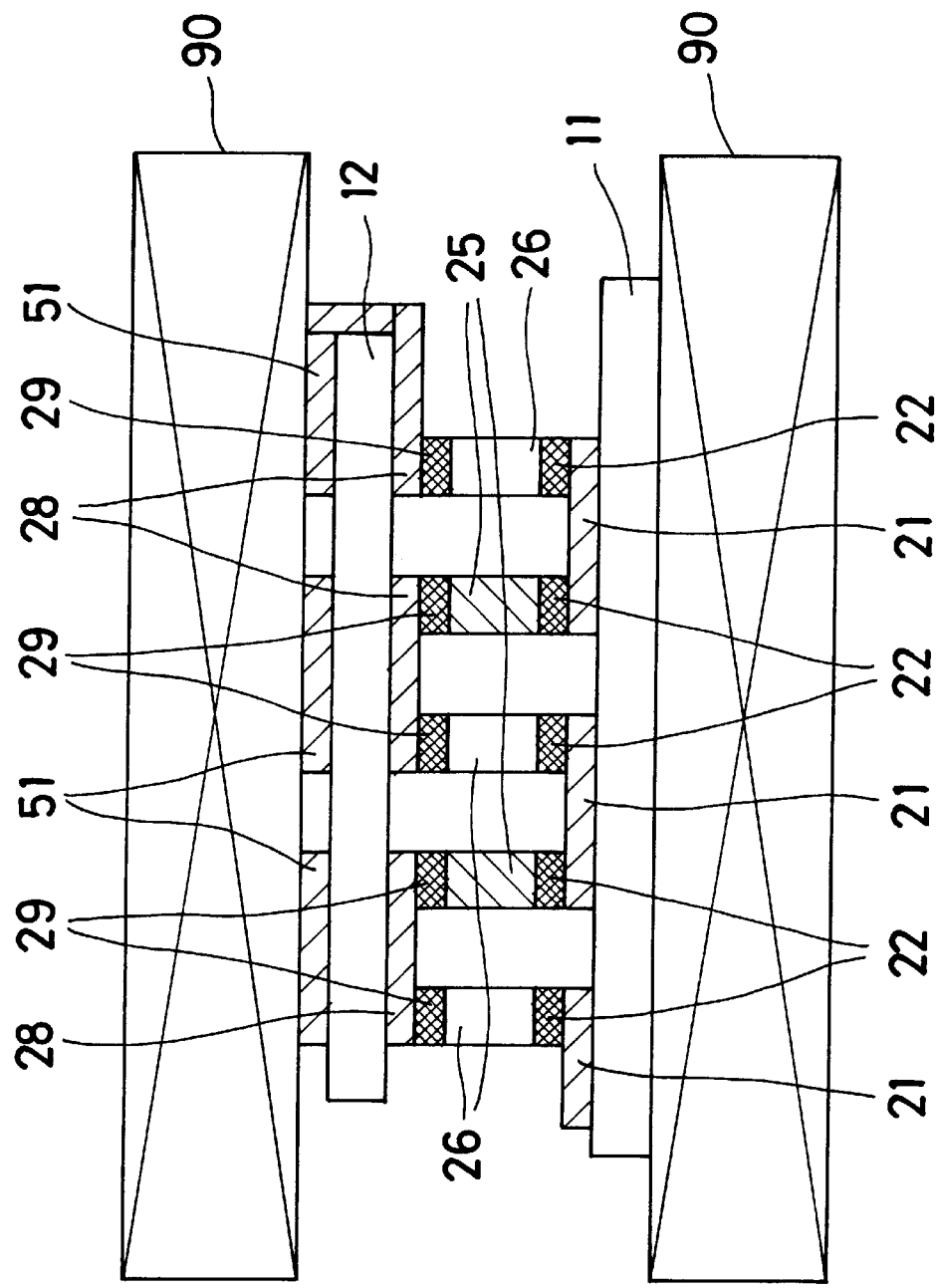
FIG. 5 shows a heating process for connecting the first and the second substrates shown in FIG. 4.
Figure 6:
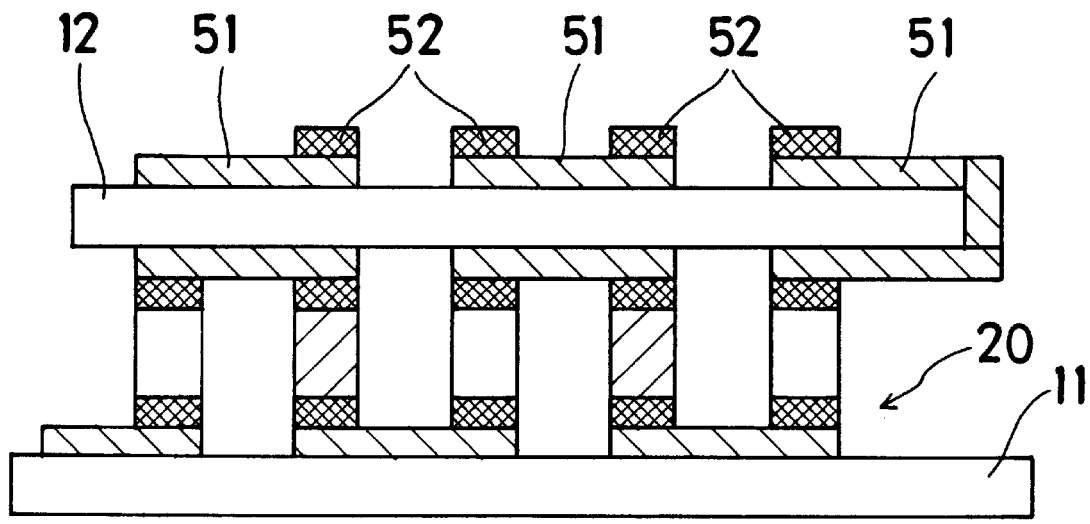
FIG. 6 shows how a solder is applied on each of electrodes of the second substrate after being combined with the first substrate.

The resultant structure is then, as a unit, sandwiched between heaters 90 as shown in FIG. 5. By supplying a current to the heaters 90 for a time period, the solders 22 and 29 are melted, resulting in that an upper end of the thermoelectric semiconductor chip 25 (26) and the corresponding electrode 28 are connected with each other, while a lower end of the thermoelectric semiconductor chip 25 (26) and the corresponding electrode 21 are connected with other. Thus, upon removal of the heaters 90 after interruption of the current supply, an assembly as shown in FIG. 6 is obtained, which has the built-in first cooling unit 20.

Figure 7:
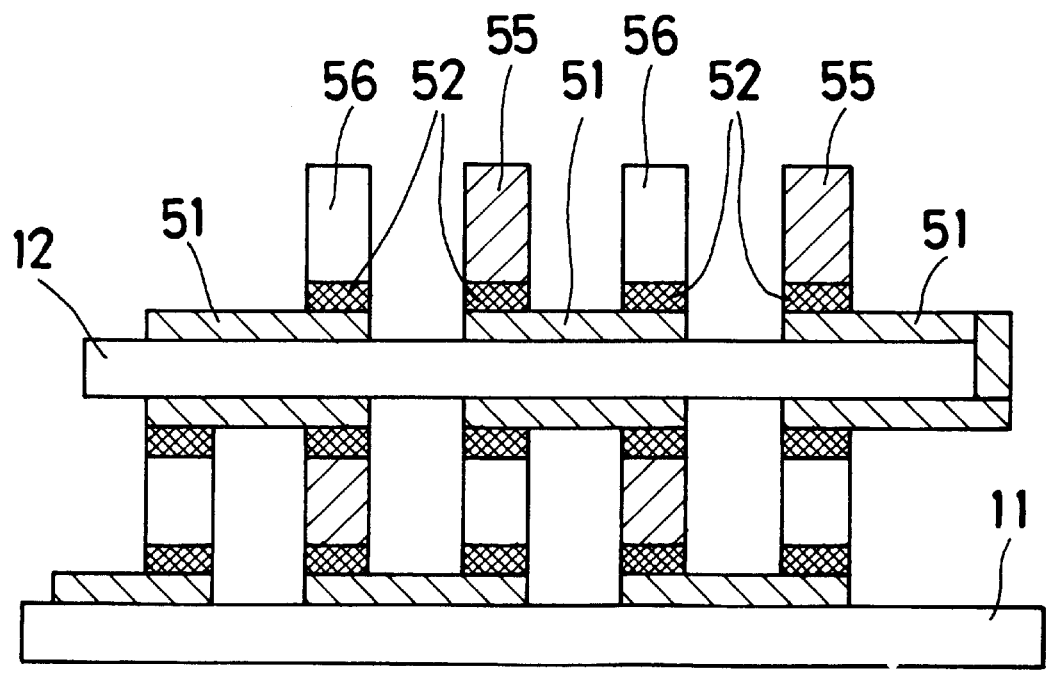
FIG. 7 shows how thermoelectric elements of a second cooling unit are mounted on the electrodes of the second substrate under the condition shown in FIG. 6.

Next, as shown in FIG. 7, on the electrode 51 of the second substrate 12, a lower end of each of p-type thermoelectric semiconductor chips 55 and n-type thermoelectric semiconductor chips 56 are alternately arranged via solder 52 having a melting point of 183 degrees Celsius and being an eutectic mixture of the tin and lead family with a composition of 63 weight percent tin and 37 weight percent lead silver.

Figure 8:
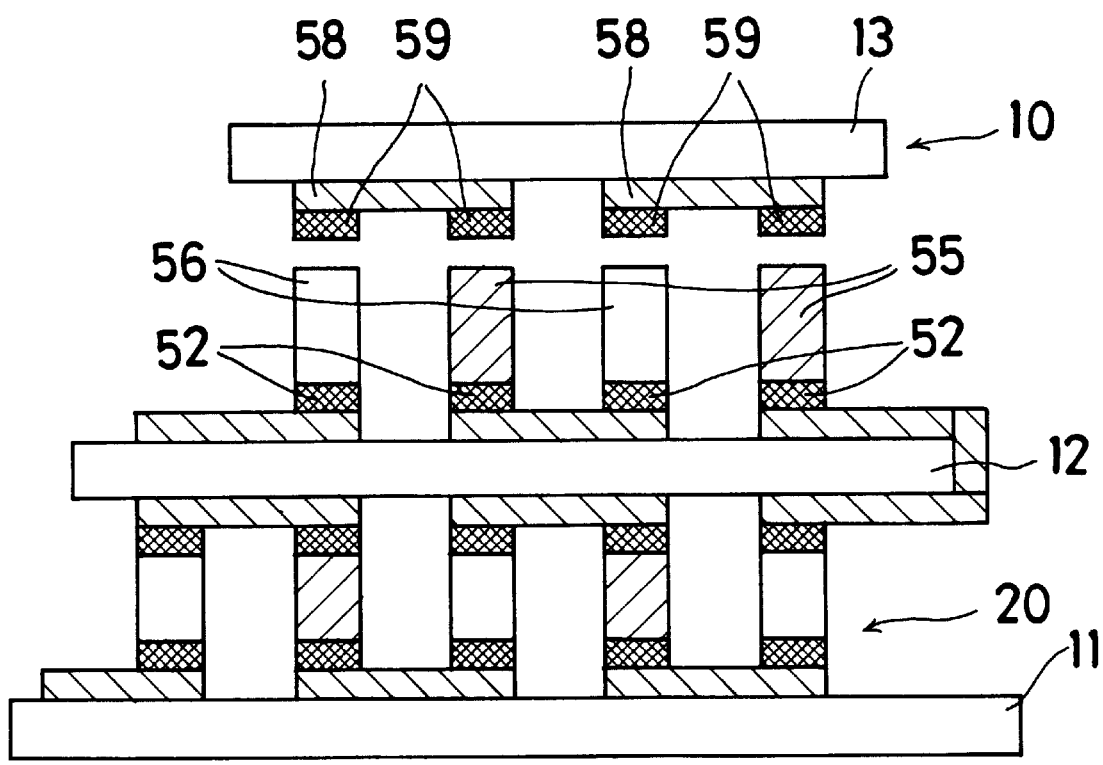
FIG. 8 shows a condition of a third substrate when it is going to be combined with the second substrate shown in FIG. 7.

The resultant structure in FIG. 7 is to have mounted thereon the third substrate 13 which is made from an aluminous-ceramic, as shown in FIG. 8, such that solders 59 on electrodes 58 on a lower surface of the third substrate 13 are on the corresponding upper ends of the thermoelectric semiconductor chips 25 (26). The solder 59, which is applied on the electrode 58 by means of screen printing, is identical with the solder 52 in melting point and composition.

Figure 9:
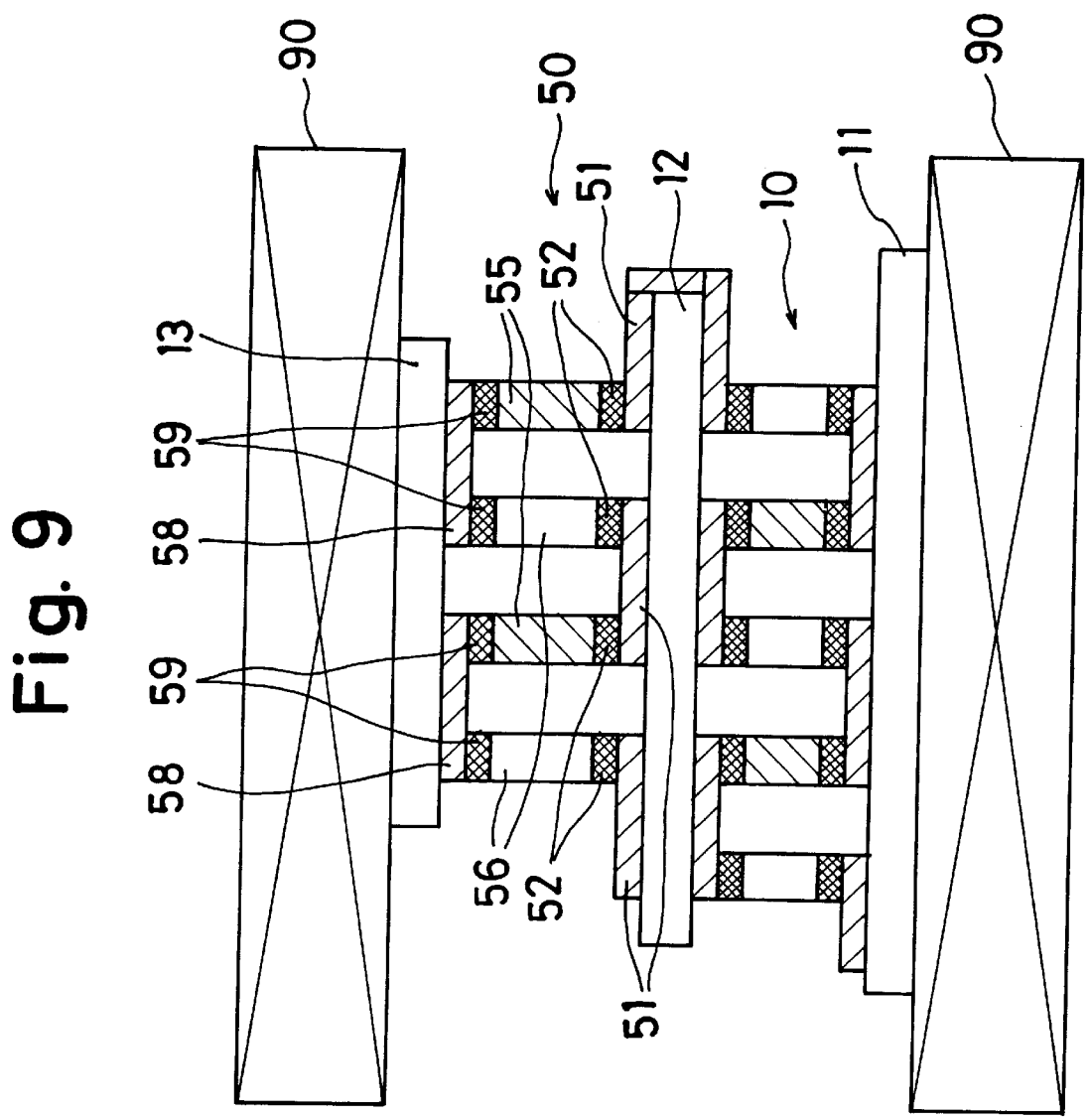
FIG. 9 shows a heating process 9 for connecting the first, the secondhand the third substrates which are in layers as shown in FIG. 8.

The resultant structure shown in FIG. 8, as a unit, is sandwiched between the heaters 90 shown in FIG. 9. By establishing a current supply to the heaters 90 for a time period, the solders 52 and 59 are melted, resulting in that the upper ends of the thermoelectric semiconductor chips 25 (26) and the corresponding electrodes 58 are connected with each other, while the lower ends of the thermoelectric semiconductor chips 25 (26) and the corresponding electrodes 51 are connected with each other. Thus, upon removal of the heaters 90 after interruption of the current supply, the multistage thermoelectric cooling device 10 as shown in FIG. 1 is obtained.

It is to be emphasized that since the melting point of each of the solders 22 and 29 is higher than that of each of the solders 52 and 59, during soldering connection between the thermoelectric semiconductor chips 55 (56) and each of the electrodes 51 and 58, the heat for melting the solders 52 and 59 does not remelt the solders 22 and 29.

The thermoelectric semiconductor chips 25 and 26 are arranged on the first substrate 11 in a matrix manner though such an arrangement is not shown, while the thermoelectric semiconductor chips 55 and 56 are also arranged in a matrix manner on the second substrate 12 though such an arrangement is not shown. As a whole, all the thermoelectric semiconductor chips are connected in series across a power source (not shown) and when a current is supplied thereto an amount of heat is evolved at each of the electrodes 21 and 51 and is absorbed at each of the electrodes 28 and 58 by the Peltier effect. Thus, the third substrate 13 is the coldest portion in the multistage thermoelectric cooling device 10.

Second Embodiment

Figure 10:
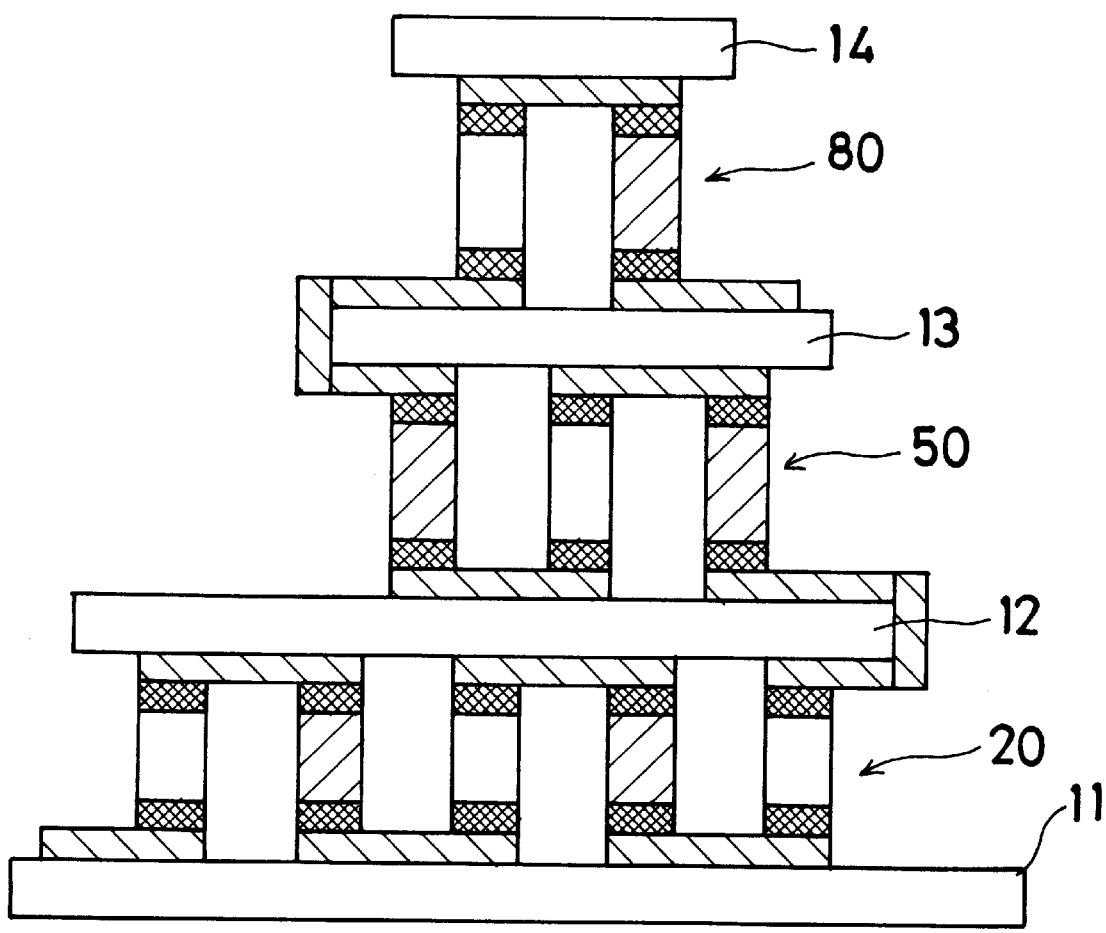
FIG. 10 shows an outline structure of a multistage thermoelectric cooling device according to a second embodiment of the present invention.

Referring to FIG. 10, a multistage thermoelectric cooling device 10 according to a second embodiment of the present invention includes a first cooling unit 20, a second cooling unit 50 and a third cooling unit 80. The first cooling unit 20 is interposed between a first substrate 11 and a second substrate 12, the second cooling unit 50 is interposed between the second substrate 12 and a third substrate 13, and the third cooling unit 80 is interposed between the third substrate 13 and a fourth substrate 14. As will be detailed later, the first cooling unit 20, the second cooling unit 50 and the third cooling unit 80 are operated relying on the Peltier effect so that the second substrate 12, the third substrate 13 and the fourth substrate 14 are cooled. As a whole, the fourth substrate 14 on which a substance (not shown) to be cooled is located is the coldest portion of the device 10.

In order to manufacture the multistage thermoelectric cooling device 10 according to the second embodiment of the present invention, the following steps or procedures are taken.

First, a lower assembly and an upper assembly are prepared which are shown at a left side and a right side, respectively, in FIG. 11. The lower assembly is constituted by the first cooling unit 20 interposed between the first substrate 11 and the second substrate 12. Cooper electrodes 51 are provided on an upper surface of the second substrate 12. Solders 52 are applied on the electrodes 51. The lower assembly having such a structure is made by way of procedures which are similar those shown in FIGS. 2 to 6 inclusive.

The upper assembly is constituted by the third cooling unit 80 interposed between the third substrate 13 and the fourth substrate 14. The third cooling unit 80 includes a p-type thermoelectric semiconductor chip 85 and an n-type thermoelectric semiconductor chip 86. A lower end of each of the thermoelectric semiconductor chips 85 and 86 is soldered via solder 82 to the corresponding cooper electrode 81 on an upper surface of the third substrate 13, while an upper end of each of the thermoelectric semiconductor chips 85 and 86 is soldered via a solder 89 to the corresponding cooper electrode 88 on a lower surface of the fourth substrate 14.

The third substrate 13 is also provided at its lower surface with cooper electrodes 58 and on each of the electrodes 58 a solder 59 is applied. The method of manufacturing the foregoing upper assembly is not detailed since it is similar to that of the foregoing lower assembly. It is to be noted that each of the solders 22, 29, 82 and 89, which are in a creamy state, has a melting point of 240 degrees Celsius and a composition of 100 weight percent tin.

Figure 12:
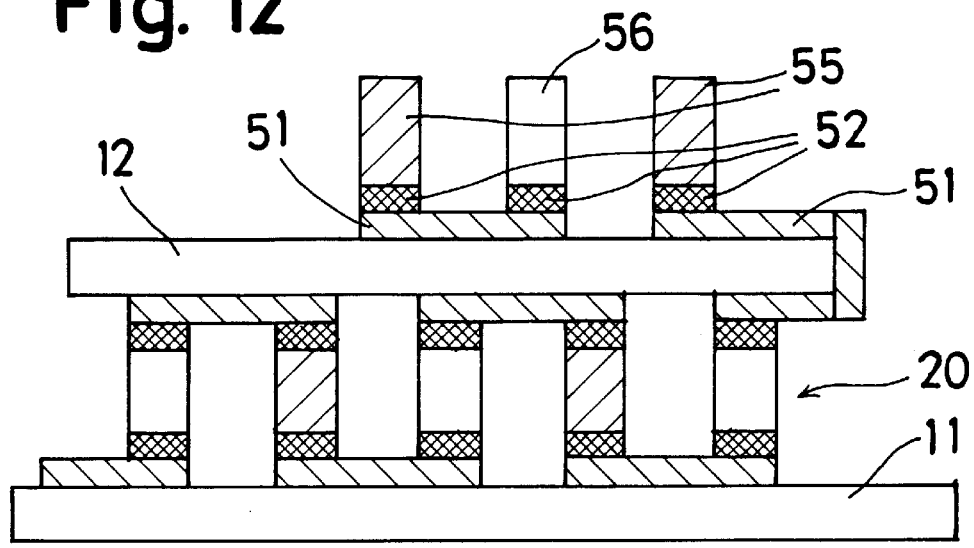
FIG. 12 shows how thermoelectric elements are mounted on the second substrate shown in FIG. 11.

Next, as shown in FIG. 12, on the lower assembly as depicted in FIG. 11 there are mounted alternately arranged p-type and n-type thermoelectric semiconductor chips 55 and 56 in such a manner that a lower end of each of the thermoelectric semiconductor chips 55 and 56 is placed on the corresponding solder 52 applied on the respective electrode 51 of the second substrate 12. Each of the solders 52 and 59, which are in a creamy state, has a melting point of 183 degrees Celsius and is a eutectic mixture of the tin and lead family with a composition of 63 weight percent tin and 37 weight percent lead.

Figure 13:
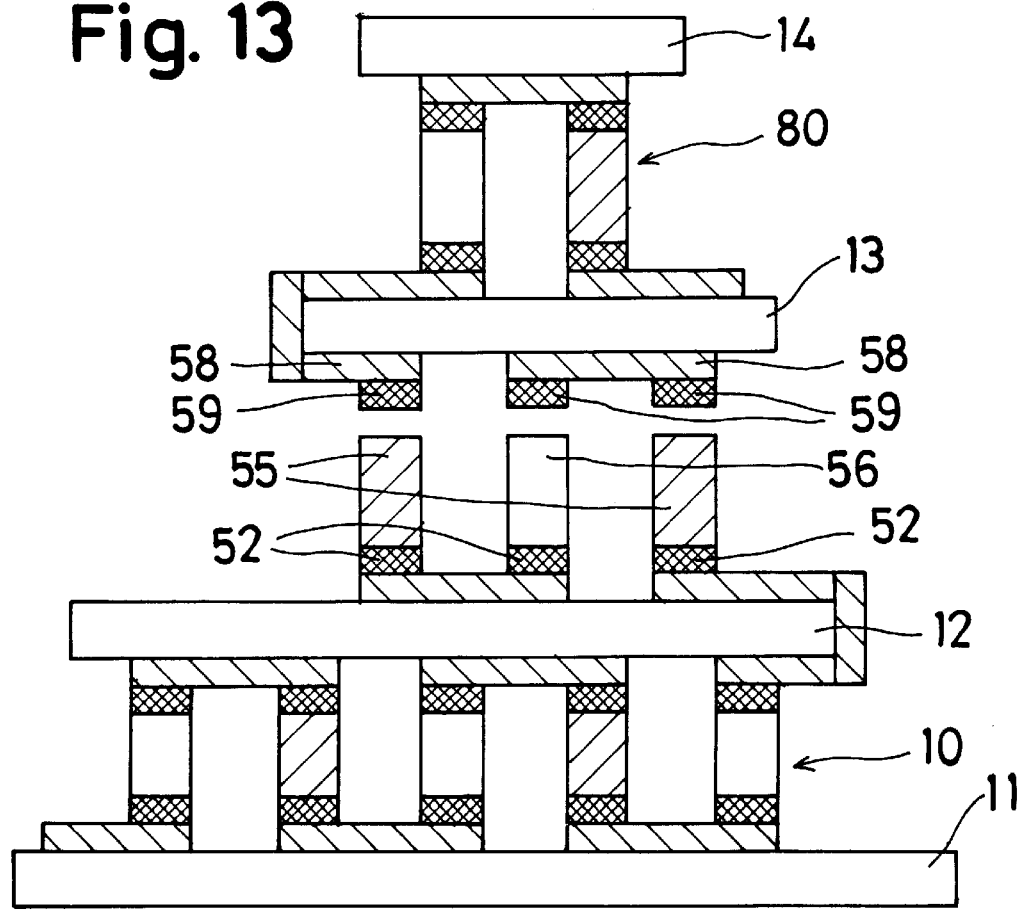
FIG. 13 shows how the third substrate shown in FIG. 11 is mounted on the thermoelectric elements on the second substrate shown in FIG. 12.

Upon establishment of the structure shown in FIG. 12, as shown in FIG. 13 the upper assembly of FIG. 11 is mounted thereon in such a manner that the solders 59 are placed on the corresponding upper ends of the thermoelectric semiconductor chips 55 and 56.

Figure 14:
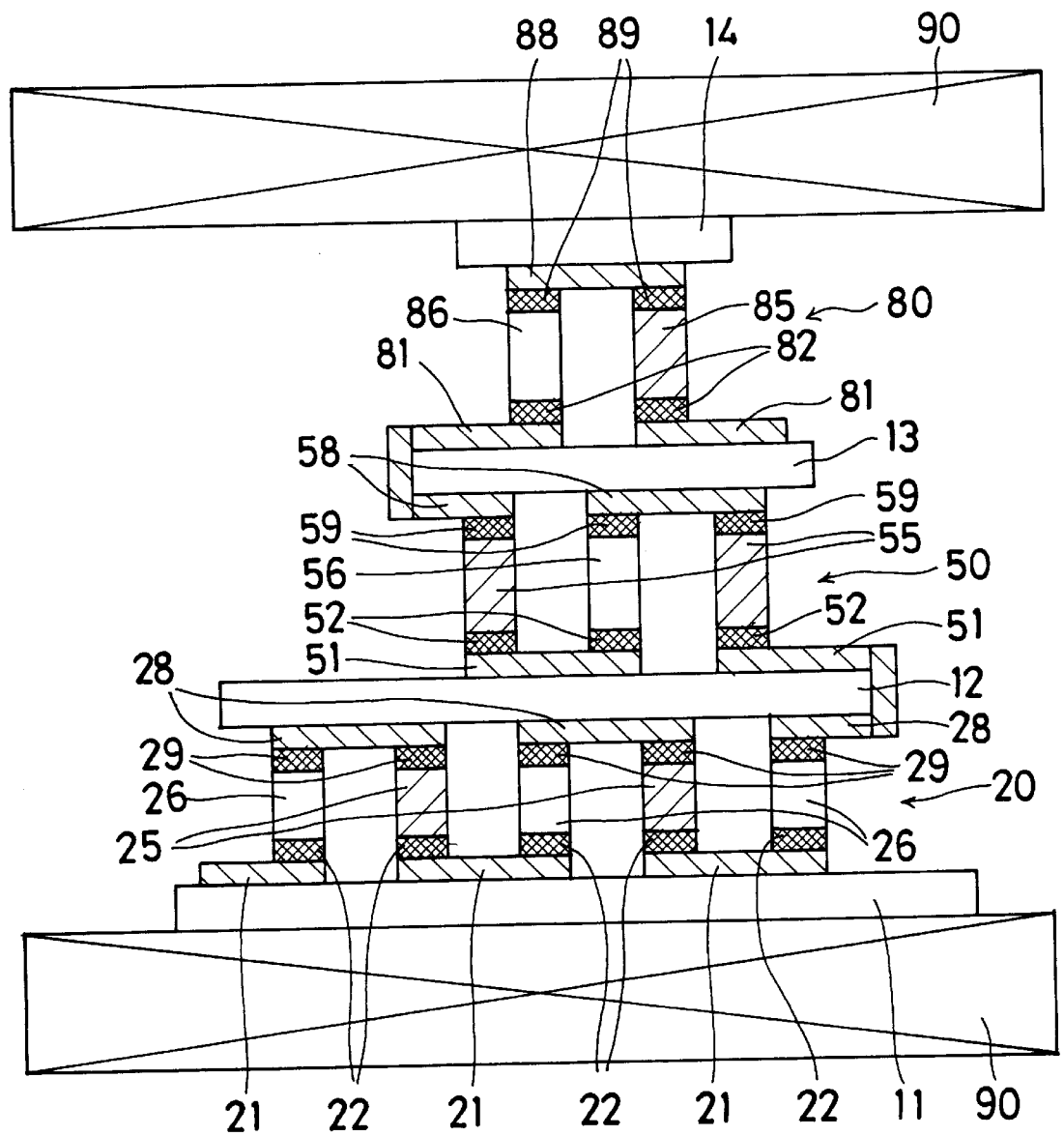
FIG. 14 shows a heating process for combining the first substrate, the first cooling unit, the second substrate, the second cooling unit, the third substrate, the third cooling unit, and the fourth substrate.

As can be seen from FIG. 14, the resultant structure in FIG. 13 is then sandwiched between heaters 90. Under such a condition, if a current is supplied to the heaters 90 for a time duration, the solders 52 and 59 are melted, with the result that the upper end and the lower end of each of the thermoelectric semiconductor chips 55 and 56 are connected to the corresponding electrodes 58 and 51, respectively.

As specified above, the meting point of each of the solders 52 and 59 is lower than that of each of the solders 22, 29, 82 and 89, so that even during the foregoing heating shown in FIG. 14, the latter solders are not remelted. Thus, removing the heaters 90 immediately after an interruption of the current supply thereto results in the multistage thermoelectric cooling device 10 shown in FIG. 10.

The thermoelectric semiconductor chips 25 and 26 are arranged on the first substrate 11 in a matrix manner, the thermoelectric semiconductor chips 55 and 56 are arranged in a matrix manner on the second substrate 12, and the thermoelectric chips 85 and 86 are arranged in a matrix manner on the third substrate 13, though such matrix arrangements are not shown. As a whole, all the thermoelectric semiconductor chips are connected in series across a power source (not shown), and when a current is supplied thereto an amount of heat is evolved at each of the electrodes 21, 51 and 81 and is absorbed at each of the electrodes 28, 58 and 88 by the Peltier effect. Thus, the fourth substrate 14 is the coldest portion in the multistage thermoelectric cooling device 10 according to the second embodiment of the present invention.

Third Embodiment

Figure 15:
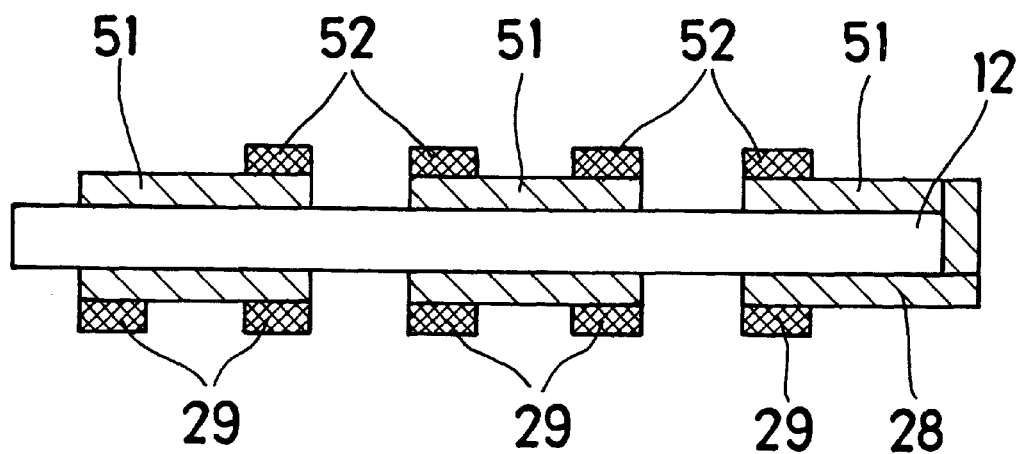
FIG. 15 shows a second substrate for a multistage thermoelectric cooling device; according to a third embodiment of the present invention.

The multistage thermoelectric cooling device 10 shown in FIG. 1 can be manufactured by other procedures which are different from those shown in FIGS. 2 through 9. In detail, in a first step shown in FIG. 15, a lower surface and an upper surface of a second substrate 12 which is made from an aluminous-ceramic are provided with electrodes 28 and electrodes 51, respectively. A solder 29 is applied on the corresponding electrode 28 by means of screen printing, while a solder 52 is applied on the corresponding electrode 51 by means of screen printing. Each of the solders 29 and 52, which are in a creamy state, has a meting point of 240 degrees Celsius and a composition of 100 weight percent tin.

The resultant second substrate 12 is mounted on a set of alternately arranged p-type thermoelectric semiconductor chips 25 and n-type thermoelectric semiconductor chips 26 which are held on a jig 95 in such a manner that each of the solders 29 is placed on the corresponding upper end of each of the thermoelectric semiconductor chips 25 and 26.

Figure 16:
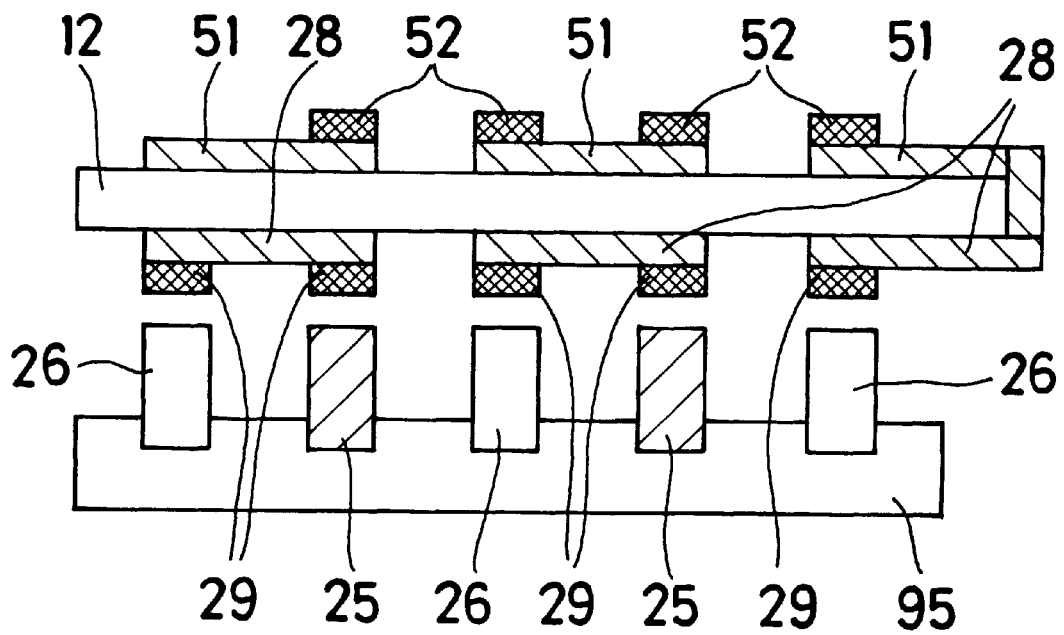
FIG. 16 shows how the second substrate shown in FIG. 15 is mounted on thermoelectric elements of a first cooling unit.
Figure 17:
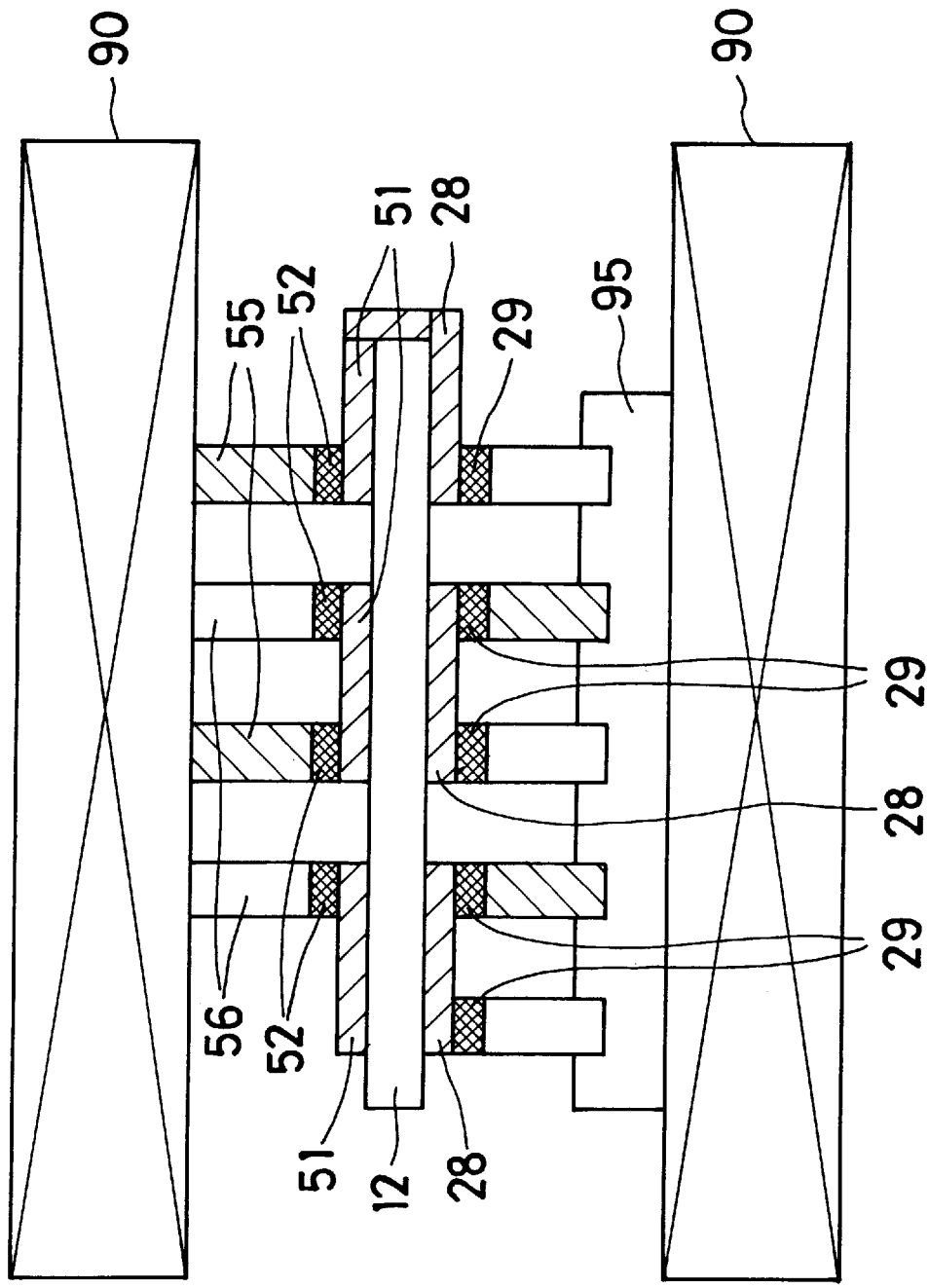
FIG. 17 shows a heating process for combining the second substrate and the thermoelectric elements, both of which are shown in FIG. 16.

Then the overlay structure shown FIG. 16 is sandwiched between heaters 90, as can be seen from FIG. 17. Under such a condition, if an amount of heat is generated at each of the heaters 90 by applying a current thereto, the solders 29 and 52 are melted, resulting in that the upper end of each of the thermoelectric semiconductor chips 25 and 26 is connected to the corresponding electrode 28, and the lower end of each of the thermoelectric semiconductor chips 55 and 56 is connected to the corresponding electrode 51. When the heaters 90 are removed after completion of such connections, the second substrate 12 has opposite surfaces equipped with a set of thermoelectric semiconductor chips 25 and 26 and another set of thermoelectric semiconductor chips 55 and 56, respectively.

Figure 18:
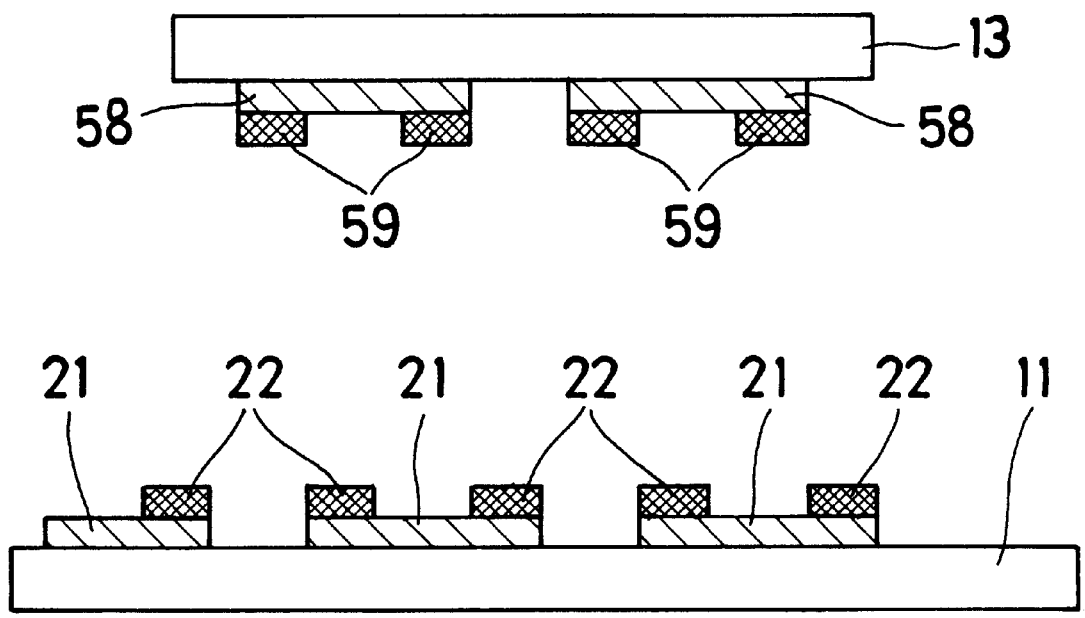
FIG. 18 shows a first substrate and a third substrate, both of which are for the device according to the third embodiment of the present invention.

Independent of the preparation of such a second substrate 12, a first substrate 11 and a third substrate 13 are prepared as shown in FIG. 18. The first substrate 11 is provided at its upper surface with cooper electrodes 21 and each of the electrodes 21 has applied thereon a solder 22, while the third substrate 13 is provided at its lower surf ace with cooper electrodes 58 and each of the electrodes 58 has applied thereon a solder 59. The solders 22 and 59 have a common melting-point of 183 degrees Celsius and are a eutectic mixture of tin and lead family with a composition of 63 weight percent tin and 37 weight percent lead.

Figure 19:
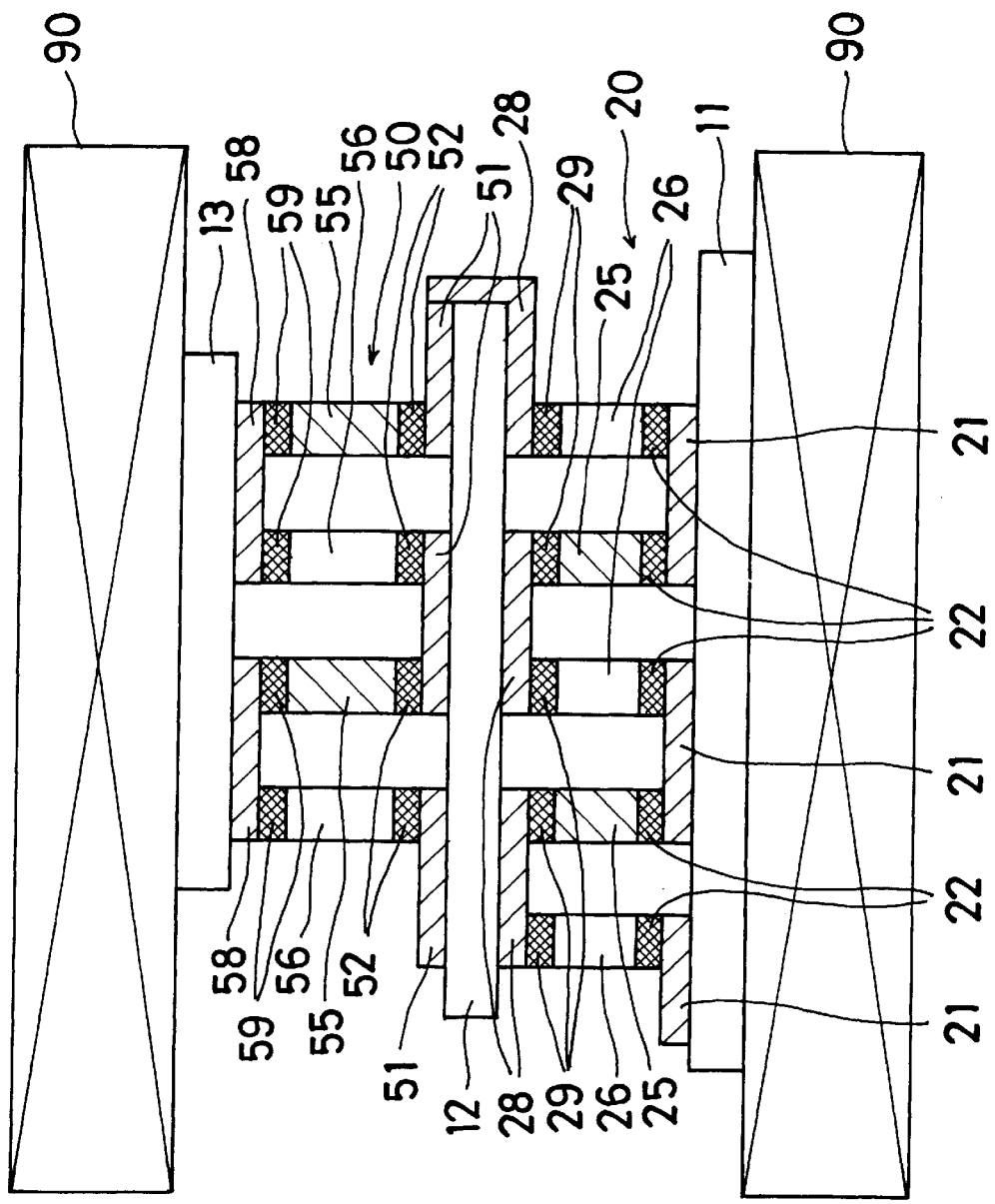
FIG. 19 shows a heating process for combining the first substrate, the first cooling unit, the second substrate, the second cooling unit and the third substrate.

The resultant first substrate 11 and the resultant third substrate 13 are held between heaters 90 as shown in FIG. 19 after insertion of the second substrate 12 derived from the process shown in FIG. 17. When heat is applied, the solder 59 is melted for establishing a connection between an upper end of each of the thermoelectric semiconductor chips 55 and 56 and the corresponding electrode electrodes 58, while similarly the solder 29 is melted for establishing a connection between a lower end of each of the thermoelectric semiconductor chips 25 and 26 and the corresponding electrode electrodes 21.

When the heaters 90 are removed after termination of current application thereto, a multistage thermoelectric cooling device (not shown) according to the third embodiment of the present invention is obtained which is similar to that shown in FIG. 1. It is to be noted that since the melting point of each of the solders 22 and 59 is lower than that of each of the solders 29 and 52 the latter will not be remelted while the former is being melted.

Fourth Embodiment

The multistage thermoelectric cooling device 10 shown in FIG. 10 can be manufactured by way of other procedures which are different from those shown in FIGS. 11 to 14 inclusive. In detail, as a first step shown in FIG. 20, a lower surface and an upper surface of a second substrate 12 which is made from an aluminous-ceramic are provided with electrodes 28 and electrodes 51, respectively. A solder 29 is applied on the corresponding electrode 28 by means of screen printing, while a solder 52 is applied on the corresponding electrode 51 by means of screen printing. Each of the solders 29 and 52, which are in a creamy state, has a melting point of 220 degrees Celsius and a composition of 97 weight percent tin and 3 weight percent silver. An upper end of each of p-type thermoelectric semiconductor chips 25 and n-type thermoelectric semiconductor chips 26 is connected to the corresponding electrode 28, while a lower end of each of p-type thermoelectric semiconductor chips 55 and n-type thermoelectric semiconductor chips 56 is connected to the corresponding electrode 51. Such connections are established by melting solders 29 and 52, respectively, and the illustrated state of the second substrate 12 is obtained by way of procedures similar to those shown in FIGS. 15 through 17.

Figure 20:
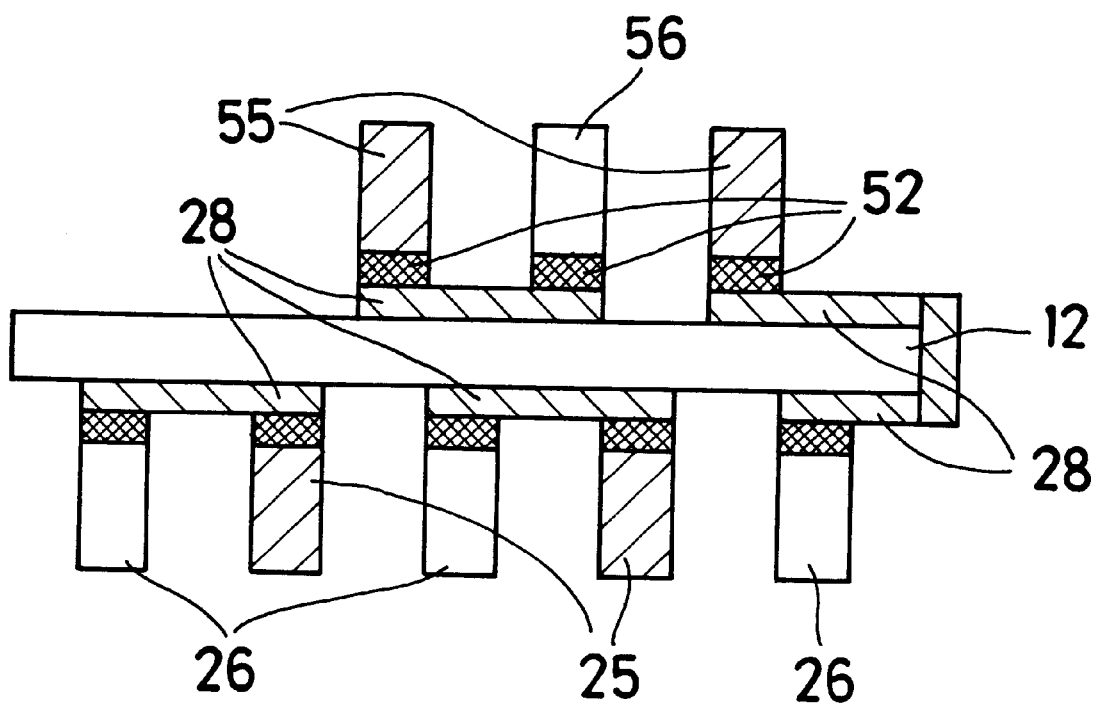
FIG. 20 shows a second substrate for a multistage thermoelectric cooling device according to the fourth embodiment of the present invention.
Figure 21:
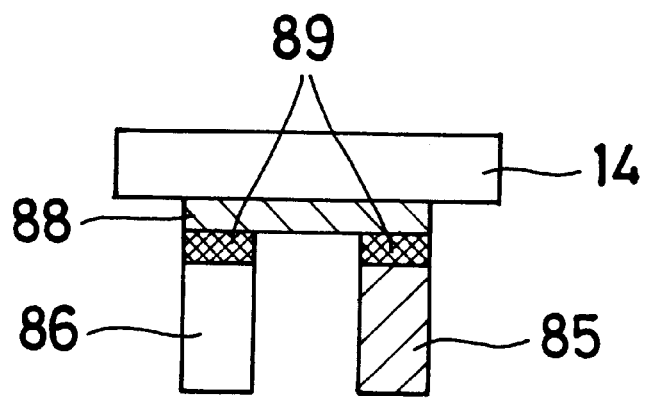
FIG. 21 shows a fourth substrate for the device according to a fourth embodiment of the present invention.

As shown in FIG. 21, apart from the production of the second substrate 12 shown in FIG. 20, a fourth substrate 14 is prepared which is of the illustrated configuration. That is, an electrode 88 is provided on a lower surface of the fourth substrate 14 positioned in the manner previously mentioned and is connected with an upper end of each of a p-type thermoelectric semiconductor chip 85 and an n-type thermoelectric semiconductor chip 86 by soldering using a solder 89. Like the solders 29 and 51, the solder 89 has a melting point of 220 degrees Celsius and a composition of 97 weight percent tin and 3 weight percent silver.

Figure 22:
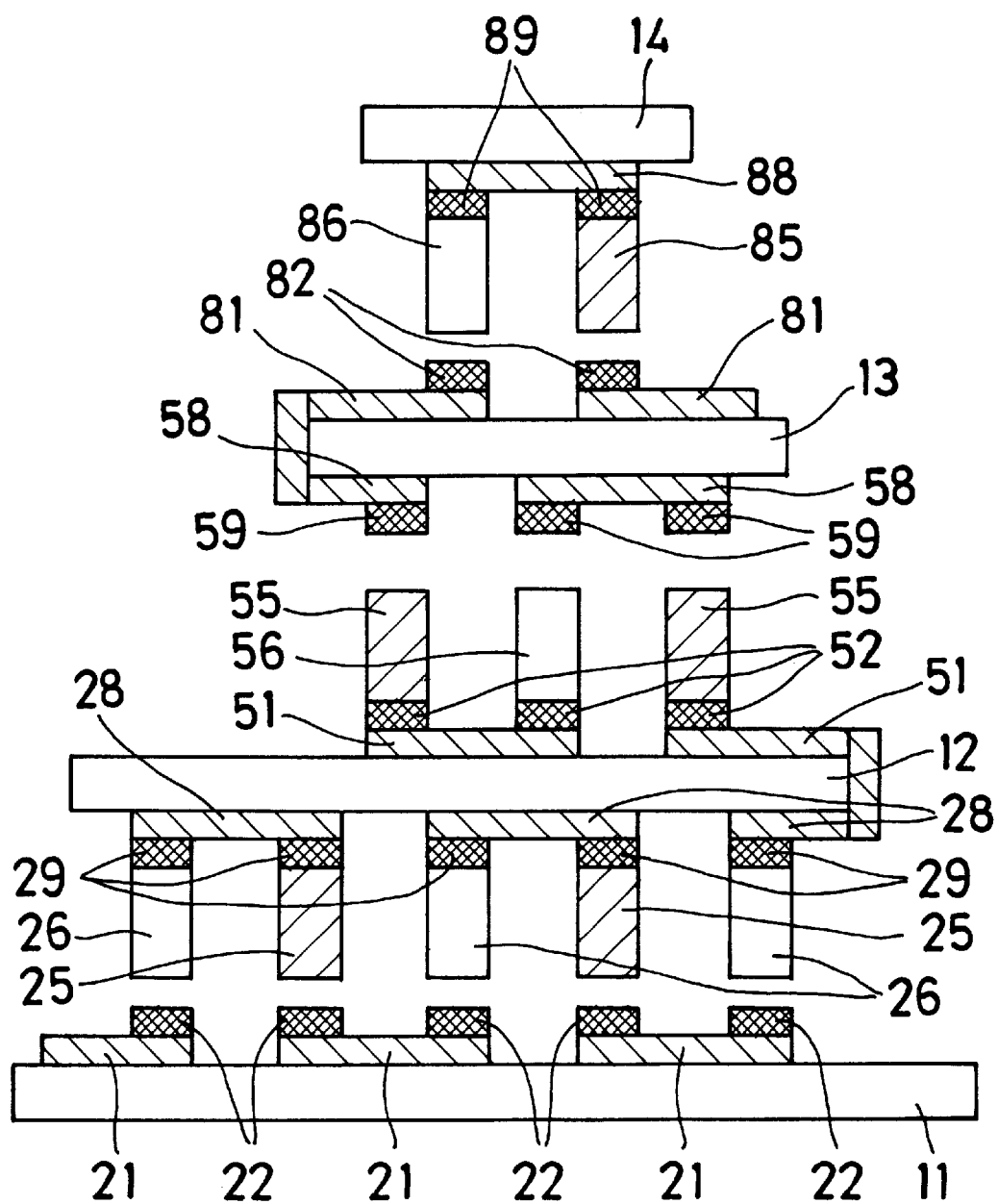
FIG. 22 shows how the first substrate, the first cooling unit, the second substrate, the second cooling unit, the third substrate, the third cooling unit and the fourth substrate are brought into a layered structure.

As shown in FIG. 22, the second substrate 12 having the structure illustrated in FIG. 20 is mounted on a first substrate 11, and the fourth substrate 14 having the configuration shown in FIG. 21 is mounted on a third substrate 13 which is also to be mounted on the second substrate 12. Under the illustrated condition in FIG. 22, cooper electrodes 21 are provided on an upper surface of the first substrate 11, a solder 22 is applied on the corresponding electrode 21 so as to be opposed to a lower end of each of the thermoelectric semiconductor chips 25 and 26. Similarly, a solder 59 is applied on the corresponding electrode 58 on a lower surface of the third substrate 13 so as to be opposed to an upper end of each of the thermoelectric semiconductor chips 55 and 56, and a solder 82 is applied on the corresponding electrode 81 on an upper surface of the third substrate 13 so as to be opposed to a lower end of each of the thermoelectric semiconductor chips 85 and 86. Each of the solders 22, 59 and 82, which are in a creamy state, has a melting point of 183 degrees Celsius and is a eutectic mixture of the tin and lead family with a composition of 63 weight percent tin and 37 weight percent lead.

Figure 23:
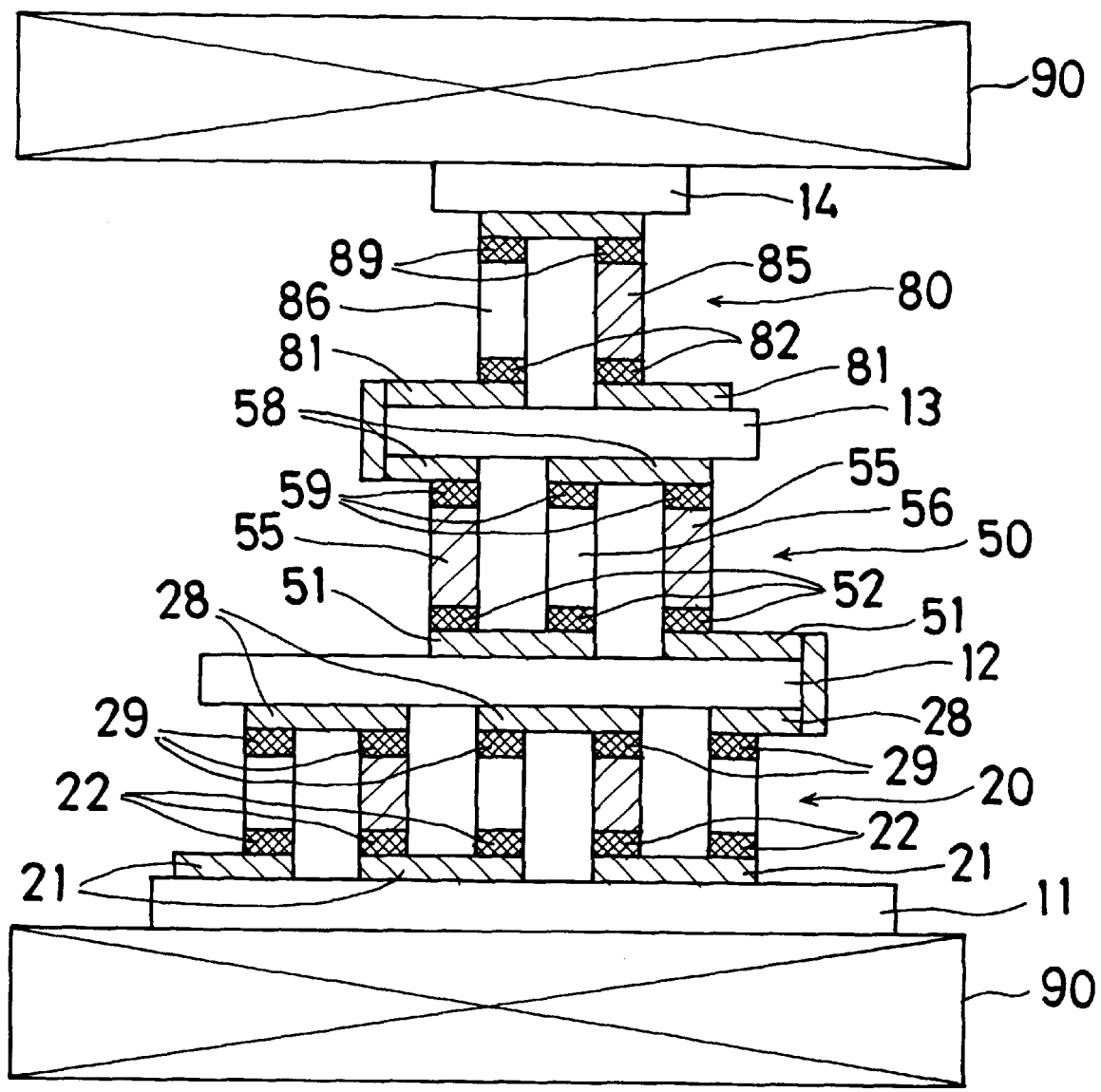
FIG. 23 shows a heating process for combining the elements shown in FIG. 22.

Then, the resultant piled or layered structure shown in FIG. 22 is, as a unit, sandwiched between heaters 90 as can be seen from FIG. 23. Under such a condition, if an amount of heat is generated at each of the heaters 90 by applying a current thereto, the solders 22, 59 and 82 are melted, resulting in that the lower end of each of the thermoelectric semiconductor chips 25 and 26 is connected to the corresponding electrode 21, the upper end of each of the thermoelectric semiconductor chips 55 and 56 is connected to the corresponding electrode 58, and the lower end of each of the thermoelectric semiconductor chips 85 and 86 is connected to the corresponding electrode 88. When the heaters 90 are removed after completion of such connections, there results a multistage thermoelectric cooling device (not shown) according to the fourth embodiment of the present invention which is similar to that shown in FIG. 10. It is to be noted that since the melting point of each of the solders 22, 59 and 82 is lower than that of each of the solders 29, 52 and 89, the latter will not be remelted while the former is being melting.

In order to confirm whether the multistage thermoelectric cooling devices meet with the design specification or rating for eliminating the drawbacks in the conventional device, tests were made on ten items for each embodiment and ten items for a comparative example from two view points: chip offset and electric conductivity, which are explained later in detail.

The comparative example is similar to the multistage thermoelectric device shown in FIG. 1 in construction except that in the former all solders have a melting point of 183 degrees Celsius and is a eutectic mixture of the tin and lead family with a composition of 63 weight percent tin and 37 weight lead.

The chip offset test is to inspect whether a specific thermoelectric semiconductor chip is in abutment with the neighbor one by being offset from the corresponding electrode in each item. If no abutted thermoelectric semiconductor chips are found, the concerned item is regarded as acceptable.

The electric conductivity test is to inspect whether after a current supply of one ampere for one minute and subsequent interruption thereof for one minute is established 200 times on a specific item, the change rate of the resultant internal resistive value thereof relative to the original internal resistive value is not less than ten percent. If a positive result is obtained, the concerned item is regarded as acceptable.

The test results reveal that all ten items according to each of the embodiments of the present invention were judged to be acceptable in both the chip offset test and the electric conductivity test. Contrary to this, three often items according to the comparative example were judged to be not acceptable in the chip offset test, while five of ten items according to the comparative example were judged not to be acceptable. Thus, such results indicate that devices manufactured by the embodiments according to the present invention are excellent in reliability.

The invention has thus been shown and described with reference to specific embodiments, however, it should be noted that the invention is in no way limited to the details of the illustrated structures but changes and modifications may be made without departing from the scope of the appended claims.

I claim:
1. A multistage thermoelectric cooling device comprising:
   a first cooling unit constructed to absorb heat at an upper side thereof by the Peltier effect, the first cooling unit having a thermoelectric element with electrodes, wherein ends of the thermoelectric element are soldered to the corresponding electrodes thereof by a first solder; and a second cooling unit constructed to absorb heat at an upper side thereof by the Peltier effect, the second cooling unit being mounted on the first heating unit to be cooled thereby and having a thermoelectric element with electrodes, wherein ends of the thermoelectric element are soldered to the corresponding electrodes thereof by a second solder whose melting point is lower than that of the first solder.

2. A multistage thermoelectric cooling device comprising:

a first cooling unit constructed to absorb heat at an upper side thereof by the Peltier effect, the first cooling unit having a thermoelectric element with electrodes, wherein ends of the thermoelectric element are soldered to the corresponding electrodes thereof by a first solder;

a second cooling unit constructed to absorb heat at an upper side thereof by the Peltier effect, the second cooling unit being mounted on the first heating unit to be cooled thereby and having a thermoelectric element with electrodes, wherein ends of the thermoelectric element are soldered to the corresponding electrodes thereof by a second solder whose melting point is lower than that of the first solder; and a third cooling unit having a thermoelectric element with electrodes, wherein ends of the thermoelectric element are soldered to the corresponding electrodes thereof by a third solder whose melting point is higher than that of the second solder, the third cooling unit being constructed to absorb heat at an upper side thereof by the Peltier effect, the third cooling unit being mounted on the second cooling unit so as to be cooled thereby.

3. A multistage thermoelectric cooling device as set forth in claim 2, wherein the first solder and the third solder have a common melting point.

4. A multistage thermoelectric cooling device comprising:

a first substrate having an upper surface;

a second substrate having an upper surface and a lower surface spaced from the upper surface of the first substrate;

a third substrate having a lower surface spaced from the upper surface of the second substrate;

a first cooling unit disposed between the first substrate and the second substrate, the first cooling unit including a first thermoelectric element another first thermoelectric element different from the first thermoelectric element in type, and an electrode adhered to the lower surface of the second substrate and soldered to each of the thermoelectric elements using a first solder so as to establish a junction therebetween at which a heat is absorbed from the second substrate when a current flows through the thermoelectric elements by the Peltier effect; and a second cooling unit disposed between the second substrate and the third substrate, the second cooling unit including a second thermoelectric element, another second thermoelectric element different from the second thermoelectric element in type, and an electrode adhered to the lower surface of the third substrate and soldered to each of the thermoelectric elements of the second cooling unit using another solder whose melting point is lower than that of the first solder so as to establish a junction therebetween at which a heat is absorbed from the third substrate by the Peltier effect when a current flows through the thermoelectric elements of the second cooling unit.

5. A multistage thermoelectric cooling device as set fourth in claim 4 further comprising a fourth substrate having a lower surface spaced from the upper surface of the third substrate and a third cooling unit disposed between the third substrate and the fourth substrate, the third cooling unit including three third thermoelectric elements connected in series such that any two adjacent thermoelectric elements are different in type, a third heat absorption electrode adhered to the lower surface of the fourth substrate and disposed between two adjacent third thermoelectric elements such that each surface thereof is soldered to the third heat absorption electrode by using a third solder whose melting point is higher than that of the second solder, and a third heat radiation electrode adhered to the upper surface of the third substrate and disposed between two other adjacent thermoelectric elements such that each surface thereof is soldered to the third heat radiation electrode by using the third solder, wherein when a current flows through the three thermoelectric elements heat is absorbed and enveloped at the third heat absorption electrode and the third heat radiation electrode, respectively, by the Peltier effect.

6. A multistage thermoelectric cooling device, as set fourth in claim 4, where in the first solder and the third solder have a common melting point.

7. A multistage thermoelectric cooling device comprising:

a first cooling unit having a thermoelectric element with electrodes, wherein ends of a thermoelectric element thereof are soldered to the corresponding electrodes thereof the first cooling unit being constructed to absorb heat at an upper side thereof by the Peltier effect; and a second cooling unit having a thermoelectric element with electrodes, wherein ends of a thermoelectric element thereof are soldered to the corresponding electrodes thereof, the second cooling unit being constructed to absorb heat at an upper side thereof by the Peltier effect, the second cooling unit being mounted on the first cooling device so as to be cooled thereby, wherein the cooling units are assembled such that a melting point of a solder used in an earlier soldering step is higher than that of another solder used in a later soldering step.

8. A multistage thermoelectric cooling device comprising:

a first cooling unit in which ends of a thermoelectric element thereof are soldered to the corresponding electrodes by a first solder, the first cooling unit being constructed to absorb heat at an upper side thereof the Peltier effect;

a second cooling unit in which ends of a thermoelectric element thereof are soldered to the corresponding electrodes by a second solder whose melting point is lower than that of the first solder, the second cooling unit being constructed to absorb heat at an upper side thereof by the Peltier effect, the second cooling unit being mounted on the first cooling device so as to be cooled thereby; and a third cooling unit in which ends of a thermoelectric element thereof are soldered to the corresponding electrodes by a third solder whose melting point is higher than that of the second solder, the third cooling unit being constructed to absorb heat at an upper side thereof by the Peltier effect, the third cooling unit being mounted on the second cooling device so as to be cooled thereby, wherein the cooling units are assembled such that a melting point of a solder used in an earlier soldering step is higher than that of another solder used in a later soldering step.

9. A multistage thermoelectric cooling device comprising a plurality of substrates, a cooling unit interposed between two adjacent ones of said plurality of substrates, said cooling unit having a heat absorbing electrode connected to a lower surface of one of the substrates, a heat radiation electrode connected to an upper surface of another of the substrates, a thermoelectric element, a solder connecting one end of the thermoelectric element to the heat absorbing electrode and another solder connecting the other end of the thermoelectric element to the heat radiating electrode, wherein the cooling unit is connected to the substrates such that the solder which is used in an earlier soldering step has a melting point which is higher than that of the solder used in a later soldering step.

10. A multistage thermoelectric cooling device comprising a plurality of substrates, a cooling unit interposed between two adjacent ones of said substrates, said cooling unit having a heat absorbing electrode connected to a lower surface of one of the substrates, a heat radiation electrode connected to an upper surface of the other of the substrates, a thermoelectric element, a solder connecting one end of the thermoelectric element to the heat absorbing electrode and another solder connecting the other end of the thermoelectric element to the heat radiating electrode, said solders being of different melting points and being arranged such that when all the elements are assembled together to constitute the multistage thermoelectric device by heating the solders, an earlier heated solder is not remelted by a later heated solder.

* * * * *